(12) United States Patent
Abrams et al.

(10) Patent No.: US 7,698,665 B2
(45) Date of Patent: Apr. 13, 2010

(54) SYSTEMS, MASKS, AND METHODS FOR MANUFACTURABLE MASKS USING A FUNCTIONAL REPRESENTATION OF POLYGON PATTERN

(75) Inventors: Daniel S. Abrams, Mountain View, CA (US); David Irby, San Jose, CA (US)

(73) Assignee: Luminescent Technologies, Inc., Palo Alto, CA (US)

( * ) Notice: Subject to any disclaimer, the term of this patent is extended or adjusted under 35 U.S.C. 154(b) by 1009 days.

(21) Appl. No.: 11/245,691

(22) Filed: Oct. 6, 2005

(65) Prior Publication Data

US 2007/0009808 A1   Jan. 11, 2007

Related U.S. Application Data

(63) Continuation-in-part of application No. 10/408,924, filed on Apr. 6, 2003, now Pat. No. 7,480,889, which is a continuation-in-part of application No. 10/408,928, filed on Apr. 6, 2003, now Pat. No. 7,124,394.

(60) Provisional application No. 60/775,991, filed on Sep. 13, 2005, provisional application No. 60/616,657, filed on Oct. 6, 2004, provisional application No. 60/616,783, filed on Oct. 6, 2004.

(51) Int. Cl.
   *G06F 17/50* (2006.01)
(52) U.S. Cl. .............................. 716/2; 716/11; 716/12; 716/19
(58) Field of Classification Search ............ 716/2, 716/11, 12, 19
See application file for complete search history.

(56) References Cited

U.S. PATENT DOCUMENTS

| | | |
|---|---|---|
| 4,752,957 A | 6/1988 | Maeda |
| 5,242,770 A | 9/1993 | Chen et al. |
| 5,301,101 A | 4/1994 | MacArthur et al. |
| 5,418,092 A | 5/1995 | Okamoto |
| 5,489,509 A | 2/1996 | Kawabata et al. |
| 5,508,803 A | 4/1996 | Hibbs et al. |
| 5,525,808 A | 6/1996 | Irie et al. |
| 5,546,189 A | 8/1996 | Svetkoff et al. |
| 5,546,225 A | 8/1996 | Shiraishi |
| 5,640,199 A | 6/1997 | Garakani et al. |

(Continued)

FOREIGN PATENT DOCUMENTS

WO   WO 2006/078791 A2   7/2006

(Continued)

OTHER PUBLICATIONS

S. Osher and R. P. Fedkiw, "Level set methods: an overview and some recent results", J. Computational Physics, vol. 169, No. 2, pp. 463 May 20, 2001.

(Continued)

*Primary Examiner*—Thuan Do
(74) *Attorney, Agent, or Firm*—Wilson Sonsini Goodrich & Rosati

(57) ABSTRACT

Photomask patterns are represented using contours defined by mask functions or other formats. Given target pattern, contours may be optimized such that defined photomask, when used in photolithographic process, prints wafer pattern faithful to target pattern. Optimized patterns or blocks may be simplified for mask manufacturing.

15 Claims, 4 Drawing Sheets

U.S. PATENT DOCUMENTS

| | | |
|---|---|---|
| 5,707,765 A | 1/1998 | Chen |
| 5,889,678 A | 3/1999 | Inoue et al. |
| 6,022,644 A | 2/2000 | Lin et al. |
| 6,042,998 A | 3/2000 | Brueck et al. |
| 6,096,567 A | 8/2000 | Kaplan et al. |
| 6,123,733 A | 9/2000 | Dalton |
| 6,383,847 B1 | 5/2002 | Ditlow et al. |
| 6,468,711 B1 | 10/2002 | Sorori et al. |
| 6,484,306 B1 | 11/2002 | Bokor et al. |
| 6,563,566 B2 | 5/2003 | Rosenbluth et al. |
| 6,596,466 B1 | 7/2003 | Pohland et al. |
| 6,601,192 B1 | 7/2003 | Bowman-Amuah |
| 6,611,627 B1 | 8/2003 | LaRossa et al. |
| 6,617,096 B2 | 9/2003 | Burkhard |
| 6,677,948 B1 | 1/2004 | Wasserman et al. |
| 6,698,007 B2 | 2/2004 | Wu et al. |
| 6,703,170 B1 | 3/2004 | Pindo |
| 6,704,920 B2 | 3/2004 | Brill et al. |
| 6,733,929 B2 | 5/2004 | Pierrat |
| 6,756,980 B2 | 6/2004 | Hayashi |
| 6,764,795 B2 | 7/2004 | Aton et al. |
| 6,787,271 B2 | 9/2004 | Cote |
| 6,795,069 B2 | 9/2004 | Raskar et al. |
| 6,798,412 B2 | 9/2004 | Cowperthwaite |
| 6,799,313 B2 | 9/2004 | LaCour |
| 6,809,797 B2 | 10/2004 | Baselmans et al. |
| 6,880,135 B2 | 4/2005 | Chang et al. |
| 6,968,532 B2 | 11/2005 | Sivakumar et al. |
| 7,027,658 B2 | 4/2006 | Osher et al. |
| 7,031,538 B2 | 4/2006 | Osher et al. |
| 7,073,162 B2 | 7/2006 | Cobb et al. |
| 7,124,394 B1 | 10/2006 | Abrams et al. |
| 7,175,945 B2 | 2/2007 | Mieher et al. |
| 7,178,127 B2 | 2/2007 | Abrams et al. |
| 7,231,628 B2 | 6/2007 | Pack et al. |
| 7,236,123 B2 | 6/2007 | Siegel |
| 7,302,090 B2 | 11/2007 | Kalus et al. |
| 7,353,145 B2 | 4/2008 | Tanaka et al. |
| 7,403,641 B2 | 7/2008 | Nakamoto et al. |
| 7,441,227 B2 | 10/2008 | Abrams et al. |
| 7,480,889 B2 | 1/2009 | Abrams et al. |
| 7,512,927 B2 | 3/2009 | Gallatin et al. |
| 7,571,423 B2 | 8/2009 | Abrams et al. |
| 2002/0028393 A1 | 3/2002 | Laidig et al. |
| 2002/0066069 A1 | 5/2002 | Ashida et al. |
| 2002/0177050 A1 | 11/2002 | Tanaka |
| 2002/0188924 A1 | 12/2002 | Pierrat et al. |
| 2003/0095267 A1 | 5/2003 | Mieher et al. |
| 2003/0103189 A1* | 6/2003 | Neureuther et al. ......... 351/176 |
| 2003/0106642 A1 | 6/2003 | Fairbairn |
| 2003/0123707 A1 | 7/2003 | Park |
| 2003/0140330 A1 | 7/2003 | Tanaka et al. |
| 2003/0152841 A1 | 8/2003 | Averbukh |
| 2003/0165749 A1 | 9/2003 | Fritze et al. |
| 2003/0198872 A1 | 10/2003 | Yamazoe et al. |
| 2004/0008880 A1 | 1/2004 | Horie et al. |
| 2004/0021660 A1 | 2/2004 | Ng-Thow-Hing et al. |
| 2004/0031013 A1 | 2/2004 | Dulman et al. |
| 2004/0073884 A1 | 4/2004 | Kroyan |
| 2004/0086792 A1 | 5/2004 | Romeo et al. |
| 2004/0101766 A1 | 5/2004 | Mesuda et al. |
| 2004/0136587 A1 | 7/2004 | Kalus et al. |
| 2004/0147121 A1 | 7/2004 | Nakagaki et al. |
| 2004/0161678 A1 | 8/2004 | Misaka |
| 2004/0166422 A1 | 8/2004 | Yamazoe et al. |
| 2004/0214096 A1 | 10/2004 | Dulman et al. |
| 2004/0229133 A1 | 11/2004 | Socha et al. |
| 2004/0265707 A1 | 12/2004 | Socha |
| 2005/0066300 A1 | 3/2005 | Zach |
| 2005/0122500 A1 | 6/2005 | Ye et al. |
| 2005/0136340 A1 | 6/2005 | Baselmans et al. |
| 2005/0142470 A1 | 6/2005 | Socha et al. |
| 2005/0147893 A1 | 7/2005 | Ogawa et al. |
| 2005/0191566 A1 | 9/2005 | Liu et al. |
| 2005/0251771 A1 | 11/2005 | Robles |
| 2005/0265605 A1 | 12/2005 | Nakamoto et al. |
| 2006/0049978 A1 | 3/2006 | Siegel |
| 2006/0051682 A1 | 3/2006 | Hess et al. |
| 2006/0172204 A1 | 8/2006 | Peng et al. |
| 2006/0273242 A1 | 12/2006 | Hunsche et al. |
| 2007/0011644 A1 | 1/2007 | Abrams et al. |
| 2007/0011647 A1 | 1/2007 | Abrams et al. |
| 2007/0011648 A1 | 1/2007 | Abrams et al. |
| 2007/0026613 A1 | 2/2007 | Ryu et al. |
| 2007/0133862 A1 | 6/2007 | Gold et al. |
| 2007/0136716 A1 | 6/2007 | Abrams et al. |
| 2007/0156327 A1 | 7/2007 | Tipping et al. |
| 2007/0184357 A1 | 8/2007 | Abrams et al. |
| 2007/0184369 A1 | 8/2007 | Abrams et al. |
| 2007/0186206 A1 | 8/2007 | Abrams et al. |
| 2007/0186208 A1 | 8/2007 | Abrams et al. |
| 2007/0192756 A1 | 8/2007 | Abrams et al. |
| 2007/0196742 A1 | 8/2007 | Abrams et al. |
| 2007/0198966 A1 | 8/2007 | Abrams et al. |
| 2007/0217566 A1 | 9/2007 | Chen et al. |
| 2009/0013304 A1 | 1/2009 | Peng |
| 2009/0073413 A1 | 3/2009 | Abrams et al. |
| 2009/0077526 A1 | 3/2009 | Abrams et al. |
| 2009/0077527 A1 | 3/2009 | Gergov et al. |

FOREIGN PATENT DOCUMENTS

| | | |
|---|---|---|
| WO | WO 2006/078791 A3 | 7/2006 |
| WO | WO 2007/033362 A2 | 3/2007 |
| WO | WO 2007/033362 A3 | 3/2007 |
| WO | WO 2007/041600 A2 | 4/2007 |
| WO | WO 2007/041600 A3 | 4/2007 |
| WO | WO 2007/041602 A2 | 4/2007 |
| WO | WO 2007/041602 A3 | 4/2007 |
| WO | WO 2007/041701 A2 | 4/2007 |
| WO | WO 2007/041701 A3 | 4/2007 |
| WO | WO 2007/044557 A2 | 4/2007 |
| WO | WO 2007/044557 A3 | 4/2007 |
| WO | WO 2007/044630 A2 | 4/2007 |
| WO | WO 2007/044630 A3 | 4/2007 |
| WO | WO 2007/044827 A2 | 4/2007 |
| WO | WO 2007/044827 A3 | 4/2007 |
| WO | WO 2008/039674 A2 | 4/2008 |
| WO | WO 2008/039674 A3 | 4/2008 |
| WO | WO 2009/036364 A1 | 3/2009 |

OTHER PUBLICATIONS

Nicolas Bailey Cobb, PhD Thesis, "Fast Optical and Process Proximity Correction Algorithms for Integrated Circuit Manufacturing", U.C. Berkeley, Spring 1998.

B.E.A. Saleh and S.I. Sayegh, "Reductions of errors of microphotographic reproductions by optical corrections of original masks", Optical Eng. vol. 20, No. 5 pp. 781-784 (1981).

K.M. Nashold and B.E.A. Saleh, "Image construction through diffraction-limited high-contrast imaging systems: an iterative approach", J. Opt. Soc. Am.A, vol. 2, No. 5 pp. 635-643 (1985).

Y. Liu and A. Zakhor, "Optimal binary image design for optical lithography", Proc. SPIE vol. 1264 pp. 401-412 (1990).

Y. Liu and A. Zakhor, "Binary and phase-shifting image design for optical lithography", Proc. SPIE vol. 1463 pp. 382-399 (1991).

A. Rosenbluth et. al, "Optimum mask and source patterns to print a given shape", $JM^3$ vol. 1 No. 1 pp. 13-30 (2002).

Y-T Wang, Y.C. Pati, H. Watanabe and T. Kailath, "Automated design of halftoned double-exposure phase-shifting masks", Proc. SPIE vol. 2440 pp. 290-301 (1995).

Y.H. Oh, and J-C Lee, "Resolution enhancement through optical proximity correction and stepper parameter optimization for 0.12-um mask pattern", Proc. SPIE vol. 3679 pp. 607-613 (1999).

J.A. Sethian and D. Adalsteinsson, "An overview of level set methods for etching, deposition, and lithography development", IEEE Trans. on Semiconductor Manufacturing, vol. 10, No. 1, pp. 167-184, Feb. 1997.

J.M. Berg and N. Zhou, "Shape-based optimization of a plasma etching process", 39$^{th}$ IEEE Conf. on Decision and Control, pp. 2023-2028 (Dec. 2000).

J.M. Geremia and H. Rabitz, "Optimal Hamiltonian identification: the synthesis of quantum optimal control and quantum inversion", J. Chem. Physics, vol. 118, No. 12 pp. 5369-5382 (Mar. 2003).

Sethian, J.A., "Level set methods and fast marching methods," 1999, Cambridge University Press, pp. 1-33.

Erdmann et al., Enhancements in Rigorous Simulation of Light Diffraction from Phase Shaft Masks, Mar. 2002, SPIE, vol. 4691, pp. 1156-1167.

Gordon et al., Lithography simulation employing rigorous solution of Maxwell's equations, Feb. 1998, SPIE, vol. 3334, pp. 176196.

Wong et al., Massively Parallel Electromagnetic Simulation for Photolithographic Applications, Oct. 1995, IEEE, vol. 14, pp. 1231-1240.

Sethian, J.A., "Level set methods and fast marching methods," 1999, Cambridge University Press, pp. 316-360 (printed from website http://math.berkeley.edu/~sethian/level_set.html).

Khan, M. et al., "A Semi-Empirical Resist Dissolution Model for Sub-micron Lithographies", pp. 41-46, by Technical Proceedings of the 1998 International Conference on Modeling and Simulation of Microsystems, 1998.

Abrams, Daniel et al., "Method for Time-Evolving Rectilinear Contours Representing Photo Masks," Response to Restriction Requirement filed Jun. 15, 2009, in U.S. Appl. No. 11/674,133, filed Feb. 12, 2007.

Abrams, Daniel et al., "Method for Time-Evolving Rectilinear Contours Representing Photo Masks," Notice of Allowance mailed Sep. 22, 2009, 2009, in U.S. Appl. No. 11/674,133, filed Feb. 12, 2007.

Abrams, Daniel et al., "Lithography Verification Using Guard Bands," Nonfinal Office Action mailed Oct. 27, 2008, in U.S. Appl. No. 11/538,290, filed Oct. 3, 2006.

Abrams, Daniel et al., "Lithography Verification Using Guard Bands," Response to Office Action filed Apr. 14, 2009, in U.S. Appl. No. 11/538,290, filed Oct. 3, 2006.

Abrams, Daniel et al., "Lithography Verification Using Guard Bands," Final Office Action mailed Jul. 7, 2009, in U.S. Appl. No. 11/538,290, filed Oct. 3, 2006.

Abrams, Daniel et al., "Lithography Verification Using Guard Bands," Response to Office Action Nov. 9, 2009, in U.S. Appl. No. 11/538,290, filed Oct. 3, 2006.

Abrams, Daniel et al., "Mask-Pattern Determination using Topology Types," Nonfinal Office Action mailed Sep. 8, 2009, in U.S. Appl. No. 11/538,420, filed Oct. 3, 2006.

Peng, Danping et al., "Systems, Masks and Methods for Printing Contact Holes and Other Patterns," Nonfinal Office Action mailed Aug. 13, 2008, in U.S. Appl. No. 11/335,018, filed Jan. 18, 2006.

Abrams, Daniel et al., "Mask-Patterns Including Intentional Breaks," Nonfinal Office Action mailed Sep. 19, 2008, in U.S. Appl. No. 11/538,782, filed Oct. 4, 2006.

Abrams, Daniel et al., "Mask-Patterns Including Intentional Breaks," Nonfinal Office Action mailed Jul. 7, 2009, in U.S. Appl. No. 11/538,782, filed Oct. 4, 2006.

Abrams, Daniel et al., "Mask-Patterns Including Intentional Breaks," Response to Office Action filed Jan. 28, 2009, in U.S. Appl. No. 11/538,782, filed Oct. 4, 2006.

Abrams, Daniel et al., "Mask-Patterns Including Intentional Breaks," Response to Office Action filed Nov. 9, 2009, in U.S. Appl. No. 11/538,782, filed Oct. 4, 2006.

Abrams, Daniel et al., "Systems, Masks, and Methods for Photomasks Optimized with Approximate and Accurate Merit Functions," Nonfinal Office Action mailed May 11, 2009, in U.S. Appl. No. 11/539,601, filed Oct. 6, 2005.

Abrams, Daniel et al., "Systems, Masks, and Methods for Photomasks Optimized with Approximate and Accurate Merit Functions," Response to Office Action filed Nov. 9, 2009, in U.S. Appl. No. 11/539,601, filed Oct. 6, 2005.

Abrams, Daniel et al., "Fast Systems and Methods for Calculating Electromagnetic Fields Near Photomasks," Nonfinal Office Action mailed Feb. 13, 2007, in U.S. Appl. No. 11/245,714, filed Oct. 6, 2005, now abandoned.

Abrams, Daniel S., et al., "Systems, Masks, and Methods for Photolithography," Notice of Allowance mailed Dec. 1, 2009, in U.S. Appl. No. 11/531,673, filed Sep. 13, 2005.

Abrams, Daniel et al., "Technique for Determining a Mask Pattern Corresponding to a Photomask," Notice of Allowance mailed Dec. 14, 2009, in U.S. Appl. No. 11/674,130, filed Feb. 12, 2007.

Abrams, Daniel et al., "Lithography Verification Using Guard Bands," Notice of Allowance mailed Dec. 28, 2009, in U.S. Appl. No. 11/538,290, filed Oct. 3, 2006.

Abrams, Daniel et al., "Systems, Masks, and Methods for Photomasks Optimized with Approximate and Accurate Merit Functions," Notice of Allowance mailed Jan. 11, 2010, in U.S. Appl. No. 11/539,601, filed Oct. 6, 2005.

Abrams, Daniel et al., "Mask-Patterns Including Intentional Breaks," Notice of Allowance mailed Jan. 29, 2010, in U.S. Appl. No. 11/538,782, filed Oct. 4, 2006.

Abrams, Daniel et al., "Method for Time-Evolving Rectilinear Contours Representing Photo Masks," Office Action mailed Nov. 23, 2009, in U.S. Appl. No. 11/674,133, filed Feb. 12, 2007.

Abrams, Daniel et al., "Method for Time-Evolving Rectilinear Contours Representing Photo Masks," Response to Nonfinal Office Action dated Jan. 7, 2010, in U.S. Appl. No. 11/674,133, filed Feb. 12, 2007.

Abrams, Daniel et al., "Mask-Pattern Determination using Topology Types," Response to Nonfinal Office Action dated Jan. 7, 2010, in U.S. Appl. No. 11/538,420, filed Oct. 3, 2006.

Sethian, J.A., "Level set methods and fast marching methods," 1999, Cambridge University Press, pp. 316-360 (printed from website http://math.berkeley.edu/~sethian/level_set.html).

Khan, M. et al., "A Semi-Empirical Resist Dissolution Model for Sub-micron Lithographies", pp. 41-46, by Technical Proceedings of the 1998 International Conference on Modeling and Simulation of Microsystems, 1998.

J.A. Sethian and D. Adalsteinsson, "An overview of level set methods for etching, deposition, and lithography development", IEEE Trans. on Semiconductor Manufacturing, vol. 10, No. 1, pp. 1-30, Jan. 8, 1996.

Abrams, Daniel S., et al., "Systems, Masks, and Methods for Photolithography," Nonfinal Office Action mailed Mar. 19, 2009, in U.S. Appl. No. 11/531,673, filed Sep. 13, 2005.

Abrams, Daniel S., et al., "Systems, Masks, and Methods for Photolithography," Response to Nonfinal Office Action filed Aug. 13, 2009, in U.S. Appl. No. 11/531,673, filed Sep. 13, 2005.

Abrams, Daniel S., et al., "Systems, Masks, and Methods for Photolithography," Notice of Allowance mailed Oct. 2, 2009, in U.S. Appl. No. 11/531,673, filed Sep. 13, 2005.

Abrams, Daniel et al., "Technique for Determining a Mask Pattern Corresponding to a Photomask," Nonfinal Office Action mailed May 28, 2009, in U.S. Appl. No. 11/674,130, filed Feb. 12, 2007.

Abrams, Daniel et al., "Technique for Determining a Mask Pattern Corresponding to a Photomask," Response to Nonfinal Office Action filed Aug. 27, 2009, in U.S. Appl. No. 11/674,130, filed Feb. 12, 2007.

Abrams, Daniel et al., "Method for Time-Evolving Rectilinear Contours Representing Photo Masks," Restriction Requirement mailed Jan. 14, 2009, in U.S. Appl. No. 11/674,133, filed Feb. 12, 2007.

* cited by examiner

SYSTEMS, MASKS, AND METHODS FOR MANUFACTURABLE MASKS USING A FUNCTIONAL REPRESENTATION OF POLYGON PATTERN

CROSS-REFERENCE

This application is a continuation-in-part application of Ser. No. 11/226,579 (converted to 60/775,991), filed Sep. 13, 2005, for Systems, Masks, and Methods for Photolithography, invented by Daniel Abrams, Danping Peng and Stanley Osher, which is incorporated herein by reference in its entirety and to which application we claim priority under 35 USC §120, which in turn is a continuation-in-part application of both application Ser. No. 10/408,924 for "Optimized Photomasks for Photolithography", filed Apr. 6, 2003, now U.S. Pat. No. 7,480,889 and application Ser. No. 10/408,928 for "Method for Time-Evolving Rectilinear Contours Representing Photo Masks", filed Apr. 6, 2003 now U.S. Pat. No. 7,124,394. This application claims the benefit of U.S. Provisional Application No. 60/616,657 filed on Oct. 6, 2004 and U.S. Provisional Application No. 60/616,783 filed on Oct. 6, 2004, both of which are incorporated herein by reference in their entirety.

FIELD OF INVENTION

Field relates to masks, also known as photomasks, used in photolithography processes and, more particularly, to systems and methods for simplifying photomask patterns so that they are more manufacturing friendly.

DESCRIPTION OF RELATED ART

Lithographic techniques are used to define patterns, geometries, features, shapes, et al ("patterns") onto an integrated circuit die or semiconductor wafer or chips where the patterns are typically defined by a set of contours, lines, boundaries, edges, curves, et al ("contours"), which generally surround, enclose, and/or define the boundary of the various regions which constitute a pattern.

Demand for increased density of features on dies and wafers has resulted in the design of circuits with decreasing minimum dimensions. However, due to the wave nature of light, as dimensions approach sizes comparable to the wavelength of the light used in the photolithography process, the resulting wafer patterns deviate from the corresponding photomask patterns and are accompanied by unwanted distortions and artifacts.

Techniques such as Optical Proximity Correction (OPC) attempt to solve this problem by appropriate pre-distortion of the photomask pattern. Many techniques for finding optimal photomasks do not naturally find patterns which are easily manufactured and may result in designs that are quite complex. The resulting designs may be problematic for a number of reasons, including (1) the data volume; (2) mask writing takes a long time and becomes expensive; and (3) mask inspection, among others. These problems are generally further exasperated by photomask designs with very small segments and or non-rectilinear geometries.

What is desired are systems and methods for optimizing and/or modifying such patterns into a format that is more easily manufactured.

SUMMARY OF THE INVENTION

An aspect of the present invention may provide for a method for modifying a photomask pattern optimized for use in producing a pattern on a workpiece, such as a semiconductor wafer, drive head, optical component or other objects. The modified pattern may be designed in such a way so as to aid in its manufacturability.

Aspects may provide for initial photomask patterns or target patterns to be provided in a hierarchical polygon representation, such as GDSII or Oasis, and for the output photomask pattern to be provided in a hierarchical polygon representation, such as GDSII or Oasis. Aspects may provide for any of the above patterns to be converted between a polygonal representation and a functional, area, or pixel representation of all or a portion of the pattern. Aspects may provide for the initial or output photomask patterns to be provided in an area, pixel, or functional representation.

Aspects may provide for a method of modifying a photomask pattern for producing a target pattern in a region of a photomask comprising providing a functional representation of a first photomask pattern having a first plurality of values over the area of the region of the photomask. The first photomask pattern may be modified to produce a functional representation of a second photomask pattern based, at least in part, upon a merit function for the target pattern and may comprises a second plurality of values over the area of the region of the photomask. The functional representation of the second photomask pattern may be converted into a functional representation of a third photomask pattern capable of being fractured into a smaller number of rectangles than the functional representation of the second photomask pattern.

Further aspects may provide for selecting adjacent values a representation of a photomask pattern that do not represent a straight boundary and replacing them with values that represent a straight boundary and/or selecting adjacent values that do not represent a stair step boundary of the second photomask pattern and replacing them with values that represent a stair step boundary and/or selecting adjacent values that do not represent a 45 degree diagonal boundary and replacing them with values that represent a 45 degree diagonal boundary.

Aspects may provide for a method of modifying a photomask pattern by identifying a plurality of short segments along a contour of a first photomask pattern and replacing the plurality of short segments with at least one segment that is longer than each of the short segments to produce a second photomask pattern. Aspects may also provide for determining whether the second photomask pattern meets a merit threshold.

Aspects may provide for optimizing a pixel based representation of a photomask pattern and then identifying a plurality of adjacent pixels in a representation of the optimized photomask pattern that do not represent a straight edge of the photomask pattern and grouping or replacing them with a representation of a straight edge in place of the plurality of adjacent pixels. Aspects may provide for further optimization of the resulting photomask pattern for by moving the straight edge instead of processing individual pixels.

Aspects may provide for a method of optimizing a photomask pattern by iteratively adjusting the position of a plurality of edge segments of the photomask pattern, wherein the plurality of edge segments correspond to portions of the photomask having a length less than 30 nanometers or less than 10 nanometers. The initial optimized pattern may have a complex structure that is difficult to manufacture. A second photomask pattern may be produced from the initial optimized photomask pattern that is capable of being fractured into a smaller number of rectangles than the initial-optimized photomask pattern.

Aspects may provide for all or a portion of any of the above patterns to be represented using mask functions. In an example embodiment, a two dimensional function may be used to represent a contour. For example, the function may be a grey scale function with values representing the area covered by the pattern within any given pixel.

Aspects may provide for the representation to be stored as function values at points across the surface of all or a portion of the photomask pattern, such as a grid of points. For example, the representation may be stored as an array in memory. Aspects may provide for function values with more than three output values or ranges of output values representing different regions of a photomask pattern. For example, the function values may be used to indicate the position of a contour with higher resolution than the grid size, such as when the contour falls in between grid points at which the function is evaluated.

Aspects may provide for a photomask pattern or target pattern to be divided into blocks for processing. For example, a polygon representation may be divided into blocks. For example, a block size of 1 micron by 1 micron up to 10 microns by 10 microns or more may be used, or any range subsumed therein, although this may be varied depending upon the size of repetitive structures or other design features in the pattern. Aspects may provide for overlapping halo regions to be included in the blocks. For example, the halo regions may be determined based on the wavelength of light used for photolithography, such as 193 nm wavelength or other wavelength light. For example, the halo region may provide for an overlap in each direction on the order of a few wavelengths. In some embodiments, the overlap in each direction may be within the range of 0.5 to 2 microns or any range subsumed therein. In some embodiments, the distance for the halo region may be in the range of 5% to 10% of the width or height of the block or any range subsumed therein. The foregoing are examples and other ranges may be used in other embodiments. In example embodiments, a photomask pattern may have more than a million, or even more than ten million gates, and may be divided into more than a million blocks.

Aspects may provide for blocks to be processed using any of the methods described above. In some embodiments, blocks may be processed in parallel using multiple processors, blades or accelerator cards. Aspects may provide for the blocks to be combined after processing to provide a mask pattern for an entire layer of a semiconductor device or other workpiece. These aspects may provide for efficient full chip processing.

Aspects may provide a method of manufacturing a photomask in accordance with a photomask pattern determined by any of the above methods. Aspects may provide a photomask with a pattern determined by any of the above methods.

Aspects may provide a method of manufacturing a semiconductor wafer or integrated circuit device using any of the above photomasks. Aspects may provide for developing a pattern in photoresist on a semiconductor wafer or other workpiece using any of the above masks, as well as etching, doping or depositing materials based in such regions to form integrated circuits or other structures. Aspects may provide for such wafers or other workpieces to be scribed into die and packaged to form integrated circuit devices or other devices. Aspects may provide for a semiconductor wafer or integrated circuit device manufactured using any of the above methods or photomasks.

Aspects may provide a design file or data structure in memory storing any of the above representations of a pattern.

Aspects may provide a computer readable medium with instructions for any of the methods or method steps described above or for storing or processing any of the patterns, representations, files or data structures described above.

Aspects may provide a computer system with a processor for executing instructions for any of the methods or method steps described above and for storing or processing any of the patterns, representations, files or data structures described above. In some embodiments, the computer system may include one or more of a processor, accelerator board, memory, storage and a network interface. Aspects may provide for any of the patterns, representations, files or data structures described above to be stored in memory or storage and processed by one or more processors or accelerators in accordance with any of the method or method steps described above. Aspects may provide for a system with a plurality of computer systems, server blades, processors or accelerators to process all or portions of a photomask pattern in parallel or in blocks as described above, which may include overlapping halo regions. Aspects may provide for an initial computer system or processor to divide a photomask pattern or design file into blocks as described above for parallel processing and to combine the processed blocks to generate a photomask pattern or design file for a mask pattern for an entire layer of a semiconductor device or other workpiece.

It is understood that each of the above aspects of the invention may be used alone or in any combination with one or more of the other aspects of the invention. The above aspects are examples only and are not intended to limit the description or claims set forth below.

DETAILED DESCRIPTION

Figure 1:
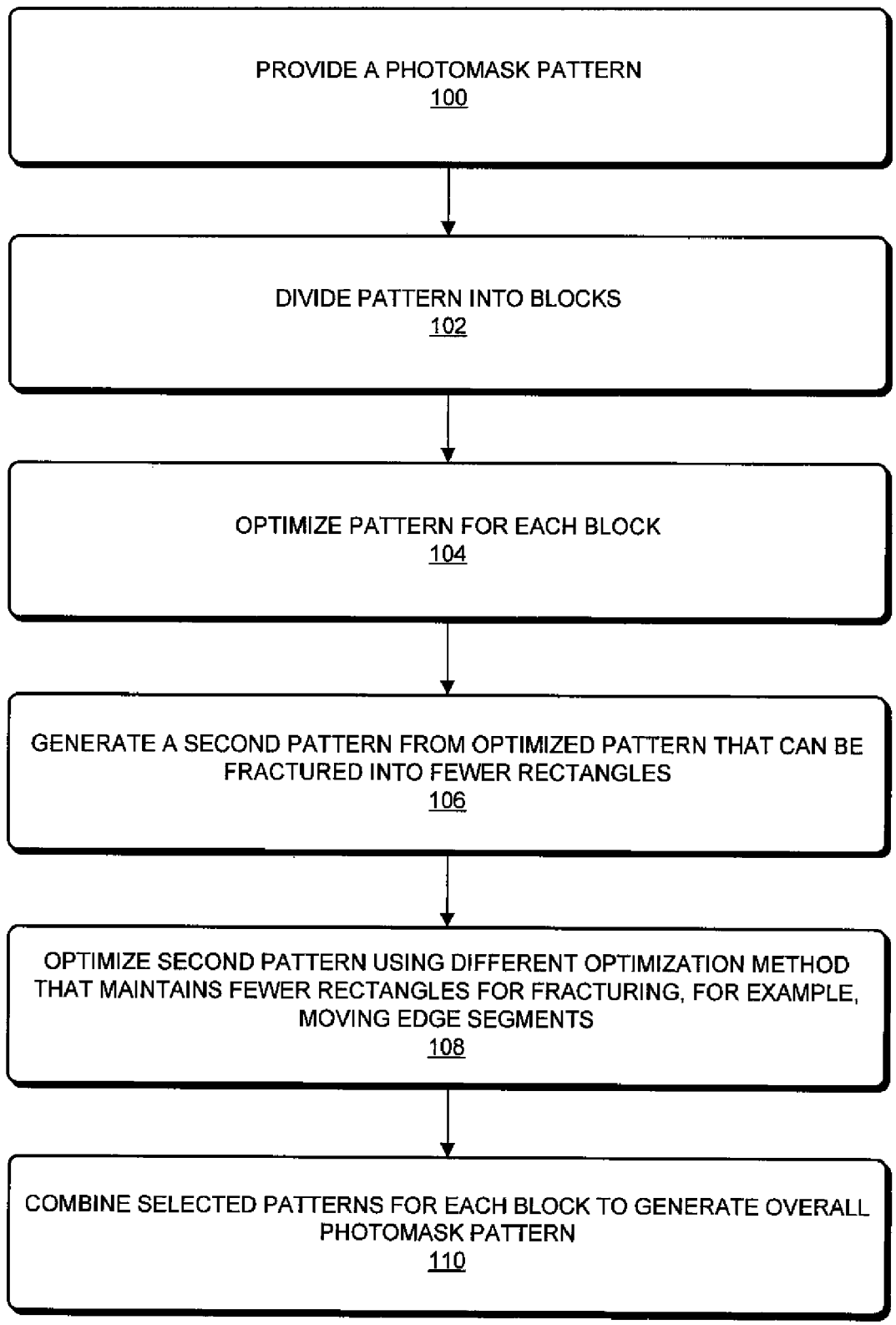
FIG. 1 is a flow chart illustrating a method according to an embodiment of the present invention.

As understood herein, the term "wafer pattern" is understood to include any polygon (rectilinear or non-rectilinear) or other shape or pattern to be formed on a semiconductor or other material substrate, for example digital or analog circuit structures or interconnect.

In some embodiments, it may be desirable to use a pixel or area based description of a photomask pattern. $\psi(x, y)$ can be a function which defines the contours implicitly in the sense that a two dimensional function is used to describe a set of contours. For example, in one embodiment the mask function $\psi(x, y)$ has the property that 1. $\psi(x, y)=0$ for all pixels that are fully "inside" a region (for example, those regions corresponding to the chrome portions of the mask);
2. $\psi(x, y)=1$ for all pixels that are fully "outside" a region (for example, those regions corresponding to the glass or quartz portions of the mask);
3. $0<\psi(x, y)<1$ for all pixels that are partly "inside" and partly "outside", where the actual value is defined by the fraction of the area covered.

In other embodiments, a variety of functional representation of the photomask, other than that described above, can be used to represent a photomask, and would fall under the scope of this invention. For example, the value of each pixel could indicate the distance to the boundary contour. In some embodiments of the present invention using grids or pixels, an adaptive mesh technique is used, whereby the grid size varies locally. We call a two dimensional function that defines the photomask a mask function or photomask function.

It is an aspect of the present invention to, given a target pattern, find a mask function that describes the optimal photomask or nearly optimal photomask for printing the desired pattern on the wafer, with the further constraint that such a pattern is manufacturing friendly. Aspects may provide for the modification of an optimal or nearly optimal photomask design that is comparatively less manufacturing friendly into a new design that is more manufacturing friendly. For instance, in some embodiments, the original design may be curvilinear and the new design may be rectilinear. In these or other embodiments, the new design may be capable of being fractured into a smaller number of rectangles than the original design.

The extent to which a photomask defined by a mask function $\psi(x, y)$ is optimal may be calculated using a functional known as the "merit function", also referred to herein as the "Hamiltonian" H. The Hamiltonian H of a mask function $\psi(x, y)$ is indicative of the degree of similarity between the printed wafer pattern and the desired target pattern, the printed wafer pattern resulting from a photolithography process using a photomask given by the contours defined by $\psi(x, y)$.

Mathematically, the Hamiltonian H is a functional which maps a function to a real number:

$$H:C(\Re^2) \to \Re$$

Optionally, the Hamiltonian also depends upon a number of real parameters, or, is a functional of multiple mask functions. The Hamiltonian is chosen so that the optimal solution has the smallest value, i.e. we seek to find a mask function which minimizes the Hamiltonian. It follows that, once an appropriate Hamiltonian is specified, the problem of finding an optimally designed photomask is equivalent to the problem of finding a mask function which minimizes the Hamiltonian.

Note that our description of the problem in terms of minimizing a Hamiltonian function is for purposes of description and not by way of limitation. Equivalent alternatives are available to one of ordinary skill in the art based on the presented description. For example, the problem can be formulated as a maximization problem rather than a minimization problem.

At this point we shall examine the steps of the flow chart of FIG. 1 in more detail:

An example algorithm may start with a set of inputs, among them an initial mask pattern given in a particular format ("pattern I/O formats"). The target pattern may also be included as input.

Possible formats would include: Image formats, such as bitmaps, JPEGs (Joint Photographic Experts Group), or other image formats; Semiconductor industry formats, such as GIF, GDSII, Oasis, OpenAccess; or Proprietary formats, such as an Electronic Design Automation (EDA) layout database;

The input patterns may also be provided in a pixel or functional representation, such as those described above, or in a vector or polygon based representation, such as those described above, or a combination.

The target pattern itself may be a representation of various types of content, for example (but not limited to): One or more levels of an IC design for a particular IC type; A pattern for a non-IC application (e.g. a MEMS device, or disk drive head, or optical component); A pattern which can be used as part of a larger design, such as a standard cell, or DRAM bit cell, etc.

The algorithm may also accepts one or more constraints as input, including (but not limited to) target pattern or mask pattern constraints, which may be specified as rules (such as critical dimensions, tolerances, etc.); and target pattern or mask pattern constraints specified as additional images (in a "pattern I/O format", polygon based representation, or pixel or functional representation) specifying for example maximal or minimal areas to be covered, or critical regions, etc.

Common input parameters may also include a minimum segment length, minimum spacing between features, and minimum feature size.

An aspect of the present invention is to refine a photomask pattern determined through some other process, for example, a pixel based mask optimization algorithm. An aspect allows that the output of the algorithm of the present invention could be fed, or otherwise used, as input into another technique or methodology for optimally providing a photomask. In general, an iterative process is contemplated in example embodiments in which a mask pattern is taken through a series of transformations, with aspects of the present invention accomplishing a subset of those transformations.

Embodiments of the present invention can also be employed using a variety of possible input patterns for a variety of possible purposes, including (for example, but not limited to) memory applications (such as DRAM, SRAM, PROM, EPROM, Flash, EEPROM, etc.), microperipheral applications (such as systems support, communication, GPUs, mass storage, voice, etc.), microprocessor applications, digital signal processor ("DSP") applications, digital bipolar logic applications (general purpose, programmable logic, application specific integrated circuits ("ASICs"), display drivers, bipolar memory, etc.), analog applications, or other non-IC related applications (like MEMS, optical devices, etc.).

Other accepted inputs include parameters of the Hamiltonian function, including but not limited to parameters of the physical model used to simulate the photolithographic process, and parameters indicating the desired attributes of the eventual solution. These may include, for example, the number and type of photomasks employed, the wavelength of a stepper machine, the type and properties of the illumination, the type and properties of the photoresist, the type and properties of the lens, etc. Other parameters may include properties of error sources, such as defocus, exposure, alignment, defects, etc.

Example embodiments may be applied to a variety of purposes, for example: Various IC applications (DRAM, SRAM, microprocessors, etc.); Various IC technologies (CMOS, MOSFET, copper, GaAs, etc.); Various lithographic processes (double mask, CMP, resist types, damascene, etc.); Various wavelengths (248 nm, 193 nm, etc.); or Various masking technologies (chrome on glass, PSM, CPL, Att-PSM, etc.) resulting from various mask writing technologies (ebeam, laser, raster-scan, shaped-beam, etc.). Example embodiments may be applied to a variety of different layers in a manufacturing process, including, for example, poly, metal, local interconnect, contact, via, metal 1, metal 2, etc.

Example embodiments may use a projection operator to simplify or enhance manufacturability of a photomask pattern. The photomask pattern may be a complex pattern resulting from the above types of mask optimization, fine grained OPC or other methods. A projection operator may be used to modify the mask pattern. The projection operator may include an algorithm or process for taking a set of possibly curvilinear contours and approximating them with a set of rectilinear contours or taking a mask pattern and replacing it with a pattern that can be fractured into fewer rectangles or other mask pattern that is more manufacturing friendly.

FIG. 1 illustrates a flow chart for a method according to an example embodiment of the present invention. As shown at 100, a photomask pattern may be provided. As described above, the pattern may be provided in a pattern I/O format. The pattern may be divided into blocks for processing as shown at 102 and individual blocks may be optimized as shown at 104. The optimized patterns may have a complex shape that is difficult to manufacture. As shown at step 106, a second pattern may be generated that is close to the optimized pattern, but easier to manufacture. A projection operator may be applied to the optimized pattern to generate the second pattern. Various approaches for generating the second pattern are described further below. As shown at 108, the second pattern may be optimized using another optimization method that maintains advantages for manufacturing. For instances, edge segments may be moved while still maintaining fewer rectangles for fracturing. Other examples are described further below. As shown at step 110, after the patterns have been generated and selected for each block, they may be reassembled into an overall optimized pattern that is easier to manufacture than if the optimized designs from step 104 had been used. This method is just an example and other combinations of these steps may be used.

In one embodiment, choose a fixed grid size (possibly corresponding to manufacturing capabilities), and "round" every contour to the nearest grid. In the grey scale bit map mask function described earlier, this is accomplished by rounding every pixel to zero or one.

An alternative embodiment of the projection operator would involve scanning the mask function in the horizontal and vertical directions, looking for stretches with approximately constant value. Such stretches can be reset to the average value along the length of the stretch, thereby straightening the contour.

The projection operator can also be used to take into account other constraints which are desirable for manufacturability of the photomask. For example, in some cases it may be desirable for the segments that compose a rectilinear photomask to line-up across the photomask, so that if the mask is written with a shaped-e-beam, the total number of shots is kept to a minimum ("Fracture friendly"). In one embodiment of the invention, the projection operator would determine a set of rectilinear contours to minimize the number of shots. This can be accomplished using the scanning method described above by considering two sides of a feature at the same time, and starting and ending segments on both sides of the feature such that they are in alignment. In other embodiments of the invention, the projection operator could correct for minimum spacing or sizing constraints.

Because there is a many-to-one mapping between photomasks and resulting wafer images, there are many possible photomasks which will yield similar results. In general, two masks which are geometrically similar will yield similar lithography. (As the difference in two masks approaches zero, the resulting lithographic differences will also approach zero). For a given feature (polygon), one property that one often desires to keep invariant is the polygon's area. In fact, on a small enough length scale, this is the only relevant property, because the photomask acts as a low pass filter. Moreover, the resulting lithography can be very sensitive to changes in area, because a small change in area is roughly equivalent to a similar change in exposure dose.

Aspects of various embodiments will allow for area to be conserved during simplification, or approximately conserved. For example, the area of the simplified pattern may be about the same or within +/−1-5% or +/−10% of the pattern that is being simplified in example embodiments.

Aspects of some embodiment may provide for simplifying a photomask pattern in such a manner so as to align segments of opposing sides of shapes. Choosing a manhattan pattern in part based on alignment of segments on opposing sides may improve the write time on ebeam machines.

In some embodiments of a projection operator, the algorithm acts on a polygon based representation rather than a mask function based representation. In one embodiment, the algorithm starts with an arbitrary vertex on the polygon; for consistency but without loss of generality we shall choose the lower leftmost vertex. The algorithm then proceeds in a given direction; without loss of generality we shall proceed clockwise. Our objective is to simplify the section from the starting vertex and ending on a final vertex several segments further away on the polygon, by reducing it to a smaller number (typically, 1-3) of longer segments. For a given final vertex, we choose the simplified polygon which minimizes the distance between the initial and final polygons, and which conserves area. Alternatively, we could choose a simplified polygon which optimizes other criteria, such as similarity of forward images. If the resulting simplified polygon is close enough to the original polygon (according to some figure-of-merit, for instance, the total area that is different between the two polygons, both inside and outside, or as another example, if the simulated forward images are sufficiently similar), then we consider this reduction a success, and move clockwise to consider the next vertex on the polygon. We continue moving in a clockwise direction until we reach a vertex for which the optimal reduction no-longer is sufficiently close to the original pattern (in which the term close could mean close in a geometric sense, or in terms of area, or according to a figure-of-merit). We then retreat to the previous successful vertex, replace the partial polygon connecting the starting and final vertices with the optimal simplified connection, and then continue the process, using the new final end point as a starting point.

Some embodiments may constrain the reduced polygons to rectilinear or rectilinear plus 45 degree geometries. Other embodiments may allow for line segments at arbitrary angles. In some embodiments, a plurality of short segments may be replaced with a longer segment or with a stair step pattern (for example, one longer horizontal and vertical segment instead of many small segments) or with a diagonal or with a horizontal or vertical segment in combination with a diagonal segment.

In the previous discussion, reference is sometimes made to conserving area. However, alternative embodiments can also be used without conserving area, in which case the simplified segments are chosen to optimize the figure-of-merit, even among non-area-conserving modifications.

In one embodiment, we divide the pattern to be simplified into primarily vertical and horizontal sections. In an example embodiment, we first break the mask into meaningful "shape" sections for which an accurate global aspect ratio can be generated. The aspect ratio is then used to determine whether to classify the shape as horizontal or vertical in order to decide if we should process the horizontal or vertical edges of the "shape". In many cases, it is best to process the vertical shapes in a vertical manner and the horizontal shapes in a horizontal manner. By shape, we mean a contiguous mask area which is suitable for processing in either a horizontal or vertical direction.

In an example embodiment, we consider a pixel based representation of the photomask. To generate the shapes a scanline is used to scan a row, or column, of data, as well as the row above and below, to give an identifying shape number to a contiguous row of mask area. For each shape the top, bottom, left and right data extent is kept, as well as a flag to mark whether the shape is empty on the top and bottom, and whether the shape has been terminated. In the cases of rows, if the row area "overlaps", or abuts area from, a shape from the row above, that row becomes part of the shape from above and is given the same shape number. If the row of data does not overlap any data from above or if it overlaps more than one shape or in general if the row is such that adding it to the current shape would not spoil the vertical nature of the shape, than it is included in the shape. A shape will continue to "grow" with each new row until there is no overlapping data, or the shape ends.

The above discussion is meant only as an example embodiment; other means of identifying horizontal and vertical shapes may also be used.

By dividing a pattern into horizontal and vertical shapes, it becomes easier to choose manhattan segments that align with each other, in such a way so as to minimize the eventual fracture account of the pattern. This is just one means to choose segments which align and other means are also possible.

For sake of clarity, the following discussion only considers a horizontal shape. In order to minimize the fracture count, it is often desired that line segments on the top and bottom of a horizontal shape are in alignment. This can be accomplished by scanning along the top and bottom of the shape, and creating a line segment on both the top and bottom that is as long as possible and meets various criteria, such as: the distance between the straightened line and the original contour is less than some value; the area difference between the original contour and simplified straightened line is no more than a certain amount; the simulated wafer images between the original contour and the simplified straightened contour are sufficiently similar, etc. These are just examples and other criteria are possible. If it is desired to minimize the fractured figure count, the distance chosen on the top and bottom of the shape must be the same, which would allow, for example, both the top and bottom segment to be written with a single shot with an ebeam. By choosing the top and bottom segments to be the same length, the process can be repeated along the horizontal shape; if the next set of segments is also the same, and the next, continuing along the shape, then all of the segments on the top and bottom will align. If such a pattern is later fractured for an ebeam writer, than it is possible for a single shot to span the shape and write both the top and bottom.

For sake of clarity, the above discussion only considers a horizontal shape. The equivalent algorithm for a vertical shape follows form the above discussion.

In some embodiments, a second pass may be performed to combine small shapes at line ends into the lines themselves. In some embodiments, line ends may be processed separately. Line ends may be processed in the same direction as the rest of the shape to which they are assigned. Consider the case in a pixel based representation where a horizontal bar is being processed by analyzing two horizontal edges. In this case the end is a vertical edge and is analyzed to determine how much area is in the first column. If the area is small compared to the neighboring column of the end line, the area may be combined into the next column. This continues until the final column is of acceptable size compared to the rest of the columns in the end line. The vertical edge of the grid for the new final column now becomes the new third edge.

In those embodiments in which patterns are aligned on both sides of a shape, if the purpose is to reduce mask writing time, it is important to choose the shape according to what is being written on the mask. For example, if a pattern consists of a set of narrow lines, the shapes chosen to be analyzed may be the lines themselves, or, alternatively, the shapes may be the spaces between the lines.

Mask simplification can be used in conjunction with any iterative mask optimization approach. For example, in one embodiment of the present invention, the projection operator is applied to the mask function after each iteration. In this way, the contours are always constrained to be rectilinear. In an alternative embodiment, the contours are allowed to evolve for multiple time-steps between applications of the projection operator, in which case the contours may temporarily deviate from strict rectilinear form. The frequency of projection may depend upon factors such as speed of computation, choice (or implementation) of the projection operator, or the manner (or implementation) of the curvilinear time-evolution Aspects of the present invention may allow for a model-based mask simplification algorithm, which uses a variety of heuristics such as those described above, in combination with a lithography model, in order to modify a mask in such a way so as to have the least impact on the resulting lithography. For example, in searching for horizontal stretches with approximately constant value, a lithography model can simulate the resulting wafer contours based on averaging pixels (and thereby straightening) over different lengths, and compare the simplified mask vs. the original mask in order to determine how long a segment may be used.

In a polygon-based representation of a mask design with many vertices, one possible heuristic is to simply eliminate some vertices and directly connect with a single line segment the two vertices which were previously connected to the eliminated vertex. In an embodiment of the present invention, in order to determine if a vertex may be safely removed, a model can be used to simulate the resulting wafer pattern both before and after the vertex is removed. If the resulting image quality is sufficient, compared to the original, then the vertex removal is considered acceptable. Otherwise, the vertex would be kept.

A variety of techniques may be used to rapidly calculate a simulated wafer image for a slightly modified design, where the wafer image of the original design is known, and the modification is a small local change, such as moving a line segment by a small displacement. Such techniques are common in model based OPC and often employ what are known to those skilled in the art as Sum over Coherent Sources or SOCS methods or kernels to calculate aerial images. Of course, the lithography model could take into account a variety of factors, including mask manufacturability, MEEF, process window, etc. In general, it is an abstract merit function, which could take into account any desired criteria, not just the quality of the nominal lithographic image.

In another embodiment, the mask simplification algorithm could have one or more parameters, either discrete or continuous, that can be optimized as the mask is simplified. For example, when a series of points is replaced with a single line, the position of said line could be optimized using the lithography model.

As described herein, the output of a mask simplification can be fed into a mask optimization, and back again, in an iterative manner. In one such embodiment, model based OPC would be performed on the output of a mask simplification algorithm as described herein. An aspect may be to use the segments as determined by the mask simplification as the segments which are moved during model based OPC. For instance, a number of pixels, segments or other portions of a mask design that do not represent a straight edge may be grouped into a straight edge or other shape for OPC. OPC or other optimization techniques may then optimize the simplified model by adjusting the position of the edge or other shape. This may be conducted even though the original pattern had been optimized using a pixel representation, functional representation, very fine grained OPC (for example, with edge segments of 30 nm or less, 20 nm or less or 10 nm or less) or other methods. Other embodiments could use other techniques to optimize the position of the segments, or even break segments into new segments or combine them together, in other steps. For example, a pixel based optimization could be performed in which the pixels are adjusted in such a way that straight line segments are kept, but their positions are adjusted.

In several embodiments described previously, various criteria are used to determine if a simplified mask pattern is sufficiently similar to an original mask pattern so as to be acceptable. In some embodiments, it may be desirable to adjust the tolerances of such criteria depending upon the situation. For example, different portions of a design may have greater or looser tolerances, depending upon their purpose. In some embodiments, the criteria would depend upon the distance to a specific feature or set of features; for example, the tolerances may be tighter near gates and looser near corners.

Aspects of the present invention provide for simplifying mask designs using a pixel based of function based representation, as well as using polygon based representations.

The flow chart shown in FIG. 1 ends with an output of the resulting photomask at step 110. The output is presumably now more suitable for manufacturing than the original input pattern. The output may be in a pixel or function representation, or in a suitable mask pattern I/O format, or in a polygon representation, or in any other format, according to the needs of the particular embodiment.

In embodiments described herein, mask simplification is often used after a pixel or function based mask optimization algorithm, or several steps of such an algorithm. However, this should not limit the scope of the invention. For example, it may be desirable to simplify a mask after a model-based OPC algorithm, or any algorithm which breaks a pattern into smaller segments and adjusts those segments. In some embodiments, a very fine segmented OPC algorithm may be used (for example, which iteratively evaluates moving edge segments having length less than 30 nm, or 20 nm or 10 nm in some embodiments), which could then be followed with mask simplification as described herein. In other embodiments, mask simplification may be undertaken as a step in virtually any process which optimizes a photomask design, or, quite generally, any process which modifies a photomask design.

Foregoing discussion frequently considers a single mask function representing contours on a single mask, the interior of those contours corresponding to chrome regions, and the exterior corresponding to glass regions. However, in many cases it will be desirable to find contours separating multiple types of regions on the same mask, for example, chrome, glass, and phase-shifted glass, and/or either alternatively or simultaneously to find contours corresponding to boundaries of regions on multiple masks, to be used in a multiple exposure process. Both generalization fall within the teachings of our invention.

To allow for multiple masks it suffices to simultaneously consider multiple mask functions. One can easily allow for multiple types of regions in a similar manner. Similarly, while the foregoing discussion refers typically to a mask consisting of only chrome and glass regions, these types of regions should not be construed to limit the applicability of the present invention, which is useful for any number of different types of regions. By way of example (but not limitation), phase-shifted regions, regions covered with materials other than chrome (e.g., in an attenuated phase shifting mask), and half-tone regions would all be within the teachings of the present invention.

Sub-Grid Resolution

In an example embodiment, the mask function may have the following useful property: when such a function is stored in a computer using a pixelized representation, that is, as a matrix of values sampled from a grid in the (x,y) plane, the pixelized representation can specify the precise location of the contours at a resolution substantially smaller than the pixel size. For example, if the pixels are stored in a computer using 32-bit floating point values, the precision of edges is limited by the 32-but float, rather than the pixel size. This is an example only and the value of a mask function may be specified with other resolutions as well, such as 64 bit values, 8 bit values or other values which can be different that the resolution provided by the pixels.

When the mask function is represented by a discrete set of values, most commonly (but not necessarily) arranged in a grid of pixels, it is often the case that the contour defining the boundaries between the regions of the photomask pattern does not fall exactly on a pixel boundary. In such a representation, one possibly beneficial approach is to initialize the pixel values such that they indicate the position of the boundary with sub-pixel resolution.

Similarly, when the final mask function is determined, it is often desired to output the result in a pattern I/O format which is different from the internal representation of the mask function. It is accordingly an aspect of the present invention that the output pattern, when described in a pattern I/O format, may have a precision or resolution that is finer than the pixel density or grid size, if such an internal representation is used, or the distance between sample points in a more complex representation. Frequently, converting an output mask from a mask function representation into a pattern I/O format with sub-pixel resolution can be accomplished by exploiting the fact that the mask function representation will often make use of several bits per pixel, and these bits specify the accurate position of the contour within the pixel, thereby allowing one to specify the pattern contour in the pattern I/O format with sub-pixel resolution.

It is also possible to represent the target pattern on a pixel based grid with a precision or resolution that is finer than the pixel density or grid size, in a manner similar to the above. This may be useful in computing the merit function in an efficient manner.

A pattern I/O format may be used to read in the target, output the final photomask, or input or output other patterns and images of masks, wafers, targets, heuristic information about the photomask (such as markings of gate regions or other special regions), or other 2-d pattern information. In one embodiment of the invention, the pattern I/O format used may be based on what we call a vector or polygon type description, by which we mean that the description of the pattern contains the start and end points of various lines, or the vertices of polygons, or other means of describing the shapes of the pattern that are not inherently pixel-based. GDSII and Oasis would be examples of such polygon-type descriptions. It is an aspect of an example embodiment of the invention that such patterns upon input or output may be converted from polygon-type representations into area or pixel based representations, or converted from area or pixel based representations into polygon-type representations. Such representations might include a representation based on binary pixels, or possibly a mask function representation as described previously, which might include, for example, a grey scale function indicating the area of coverage of pixels. Such conversions between formats may take place at a resolution finer than the pixel size or grid size of the area based representation, if it uses pixels or values sampled on a grid.

In some embodiments, an entire photomask may be provided as input, and an entire simplified photomask generated as output. An aspect may provide for the photomask to be provided in a hierarchical format, in which case the output may be flattened or may be hierarchical with the same or with different hierarchy.

In some embodiments, an entire photomask may be provided as input to some other algorithm or process, which in the course of its computation, would break the photomask into various regions or pieces. Each piece may then be simplified and then may undergo further processing. For example, in an optimization process, a large photomask pattern may be divided into many smaller regions, which are each optimized separately. They could then each be simplified separately. Other operations may or may not be performed, and then, optionally, the photomask may be assembled back together.

Parallel System

It is often the case that a photomask will be quite large, in the sense of having a large number of contours. Alternatively, in a pixelized representation, such a photomask would consist of a large number of pixels. Computing the design for an entire photomask at one time on a single CPU may be computationally demanding. In such situations, it may be beneficial to divide the pattern into separate regions, and process each region on a separate compute node in a cluster of machines.

There are several ways in which such parallelization can be accomplished. In one approach, the plane is partitioned into non-overlapping regions, with each region to be solved on a particular compute node, and each individual node communicates information about the region it is processing and its boundary conditions to those nodes that are processing neighboring regions. An advantage of this method is that a large number of processors can be used simultaneously to solve for optimal mask function over a large area, in such a manner that the solution obtained would be exactly the same as in the case in which all of the work was accomplished on a single node. Similarly, a large number of processors can be used simultaneously generate simplified patterns from the optimized patterns for each block.

Figure 2:
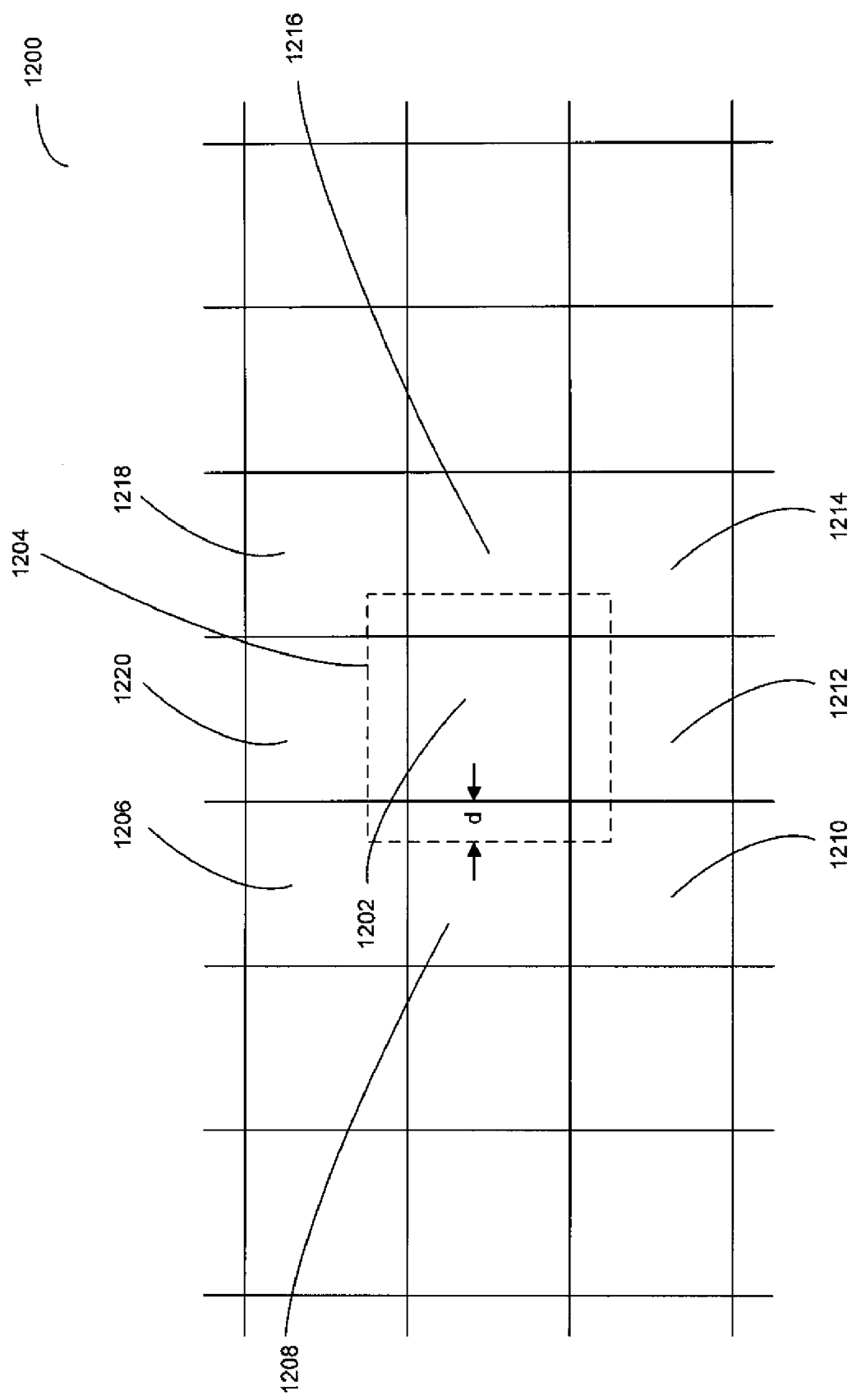
FIG. 2 is a diagram illustrating a halo around a block of a photomask pattern according to an embodiment of the present invention.

In an alternative approach, the plane is divided into separate non-overlapping regions, but when such regions are processed on individual compute nodes, the machines compute the optimal mask for each region along with a halo region of a fixed thickness surrounding the given region. Because the impact of one area of a photomask on another area of the same mask diminishes with distance, the mask function found in this approach will be almost the same as if the entire mask was processed on a single compute node, as long as the halo thickness is sufficiently large. FIG. 2 illustrates a portion of a photomask pattern divided into an array of blocks 1200, including block 1202. The block 1202 will have a target pattern specified for a portion of the integrated circuit or other workpiece. The size of the blocks may depend upon the features of the design, including the size of repetitive structure, boundaries that provide processing efficiency, or other criteria. In some embodiments, a fixed block size may also be specified. For instance, in an example embodiment, the blocks in FIG. 2 may range from 1 micron by 1 micron to 10 microns by 10 microns, or any range subsumed therein. These are examples only and other block sizes may be used. As shown by the dashed line at 1204, a halo may be defined around block 1202. This halo overlaps with adjacent blocks 1206, 1208, 1210, 1212, 1214, 1216 and 1220. The halo extends beyond the block 1204 by a distance d in each direction. The distance may be selected based on process parameters and the level of expected interference from adjacent regions and computational complexity (since the halo increases the size of each region that is be processed). While the size of the halo may vary, in some embodiments, it may range from 0.5 microns to 2 microns or any rang subsumed therein or from 5% to 10% of the width or height of the block or any range subsumed therein. These are examples only and other halo sizes may be used.

An advantage of this method is that each region along with its halo can be processed completely independently of all other regions. In yet another approach, the entire photomask is divided into regions with halos as above, but the computer analyzes such regions in order to find repetition. If a particular region of the target pattern, halo included, is identical to a similar area in another portion of the target pattern, then this region need only be processed once, since both instances will yield identical results. Since it often occurs that a single pattern repeats many times throughout a target design, using this approach to eliminate repetition can be advantageous. Other approaches to parallelizing the problem are also possible, depending on the computer architecture.

In one embodiment of the invention, the target design is provided as one of a set of inputs to a computer system. The design could be sent over a network or it could be provided on tape or on a variety of removable storage media. The computer system would begin by analyzing the design and breaking it into a large number of individual pieces. In one embodiment, the design is stored in a file system, and one or more servers that have access to the file system would perform this step. Alternatively, the file system may be local to one or more of the servers (such as a local hard drive). The cutting up of the design could be based upon a variety of criteria, as there are multiple ways of dividing a design into pieces. The pieces may be square, or rectangular, or any other shape. It is usually preferable for the pieces to be non-overlapping (not counting the halos, which if they are included, are overlapping by definition), but it is not necessary for the pieces to be non-over-lapping. In some embodiments, the design may be stored in an intermediate format, different from the original input format. In one embodiment, the design is "flattened" before processing, so that the breaking of the design into pieces does not need to consider hierarchy. In another embodiment, a partition is predetermined to guide the cutting processes, and as the input file is read, polygons are divided into files according to which partition they would fall under. Still other approaches for reading, analyzing, and breaking a design into pieces are possible within the scope of the invention.

Once the design has been broken into multiple pieces, each piece could then be sent to one or more servers designed to process the pieces and solve for the optimal photomask for each piece. The second set of servers may include the original set of servers, or may be a distinct machine or set of machines. The transmitting of the data could include sending the data over Ethernet, or Myrinet, or Infiniband, or any other method by which two or more computers can exchange information.

Alternatively, the separate pieces can be written to a file system which one or more servers can access independently, as a means of transferring data from the original set of machines to the second set of machines. The data describing the individual pieces could be based on a pattern I/O format, or another polygon-type representation, or it could be a pixel or grid based representation, or an area based representation, such as a mask function or bit map. Optionally, additional information could be included, such as process information, for example, the wavelength or numerical aperture. In one embodiment of the invention, the individual pieces include halos so that they can be processed separately. In an alternative embodiment, some pieces may not include halos or may include halos on only some of the edges, and information is shared between pieces, as described previously, in order to address the boundaries for the edges which are not padded by halos. Such an implementation may be used, for example, on a shared memory multi-CPU machine, where information is easily and efficiently transferred between simultaneously running processes.

As it may be advantageous to minimize the amount of processing that needs to be completed, in some embodiments the system may optionally determine if there is repetition among pieces of the design to be processed. One way in which this can be accomplished is to calculate a signature for each piece, and then look for pieces with identical signatures. Another approach is to simply compare the pieces directly. In one embodiment, this repetition analysis is done during the first step, before the pieces are sent to be processed. Alternatively, in the second step, before a server begins to process a piece, it can look to see if an identical piece has been processed previously. Other approaches are also possible and fall within the scope of the invention. Because the decision as to how the pieces are cut will impact the amount of repetition, in some embodiments it may be desirable to consider possible repetition in the design during the cutting step. For example, if a design is based on cells, the pieces can be chosen to correspond to the individual cells, which are likely to appear in more than one place. Another possibility would be to choose rectangles which correspond to groups of such cells. Still another embodiment would arbitrarily cut the design into strips in one direction, but within each strip, choose rectangular pieces which are aligned with cell boundaries or other elements of the design, in such a way so as to maximize the possibility of finding repetition.

Once all the individual pieces are processed, the results are transferred to a third set of servers, which may be one or more servers and may or may not include one or more servers from the first and second set. Transferring of data can take place by a variety of means and in a variety of format, as above, when the pieces were originally sent to the second set of machines. Finally, the third set of machines assembles the pieces back together into a complete photomask design. In one embodiment, the individual pieces of optimized and simplified photomask are combined into a single GDSII file. In other embodiments, the output might be multiple files, and it is possible to have a separate file for each piece in some embodiments.

It is possible that one or more of the steps outlined above could be executed in parallel on one or more machines; for example, as the input design is processed, individual pieces could be sent to another machine which would compute the optimal mask and then forward the piece to a third machine which would begin assembling the pieces together. Such an approach could be considered a pipe-lined architecture. Similarly, parts of one or more of the steps could be completed on one or more servers while others are working on one or more of the other steps. In some embodiments, all of the steps would be performed on a single machine, or a single multi-processor machine (i.e., a single machine with multiple CPUs).

In the foregoing discussion, the servers described above could be any one of a number of different computing devices. One possibility would be standard blade servers; another possibility would be standard 1U rack mounted servers, or rack mount servers of various sizes, or another possibility would be a cluster of standard desktop machines or towers. In one embodiment, the processing would take place on a general purpose microprocessors, also called a GPU or CPU. For example, an Intel Pentium or AMD Opteron could be used. In other embodiments, the computing could be done on an FPGA, DSP, or ASIC. In one embodiment, some of the work would be done on a GPU and other parts of the work would be done another device. For example, the GPU could be used to process polygons, transfer data, read and write files, convert formats, and a variety of general tasks, and an FPGA could be used to perform the individual steps of the optimization. It is possible that an FPGA or ASIC could be specifically designed to perform operations on a mask function. One approach would be to use an FPGA, DSP, or ASIC to exploit the parallelization inherent in processing large arrays of pixel values used to represent a mask function. For example, a server could consist of a standard GPU along with a special accelerator board attached to the server which contains one or more FPGAs, DSPs, or ASICs, along with local on board memory. Pieces of designs could be passed to the GPU for processing, which would perform miscellaneous tasks as described above, and then transfer arrays to the board containing the special purpose processors, which would then perform computations on the mask function. The resulting optimal mask function could then be transferred back into the main memory of the mother board, allowing the GPU to perform any additional post processing and/or transfer the results back to another server or set of servers, for assembly as in the third step described above. It is also possible that the system could be designed such that the GPU has access to the memory of the accelerator board as well as its own memory, and in some embodiments the GPU might perform operations on the mask function interspersed with work performed by the FPGAs, DSPs, or ASICs.

Example System Architectures

Figure 3:
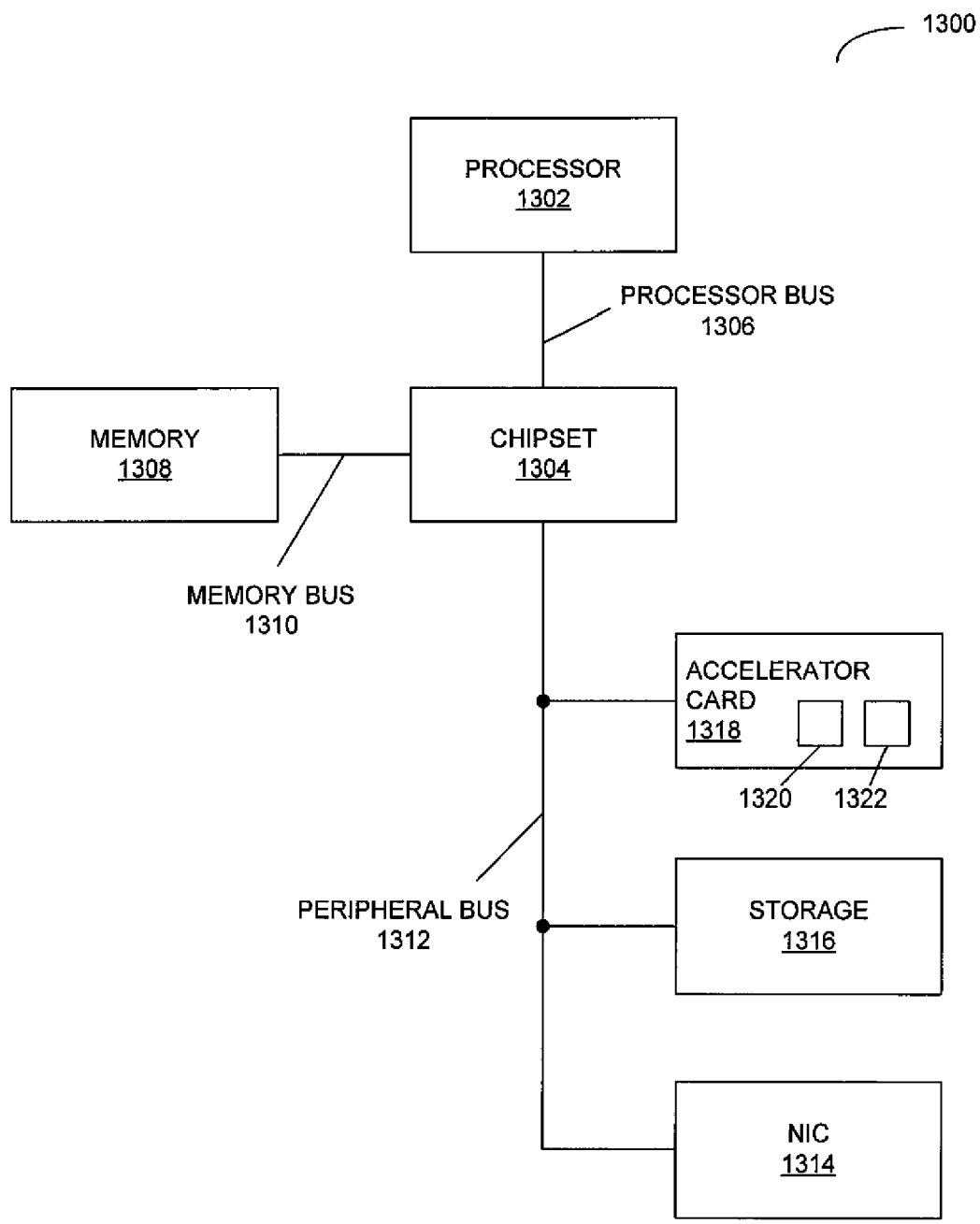
FIG. 3 is an example computer system according to an embodiment of the present invention.

FIG. 3 is a block diagram showing the architecture of an example computer system, generally indicated at 1300, according to an embodiment of the present invention. As shown in the example embodiment of FIG. 3, the computer system may include a processor 1302 for processing instructions, such as a Intel Pentium™ processor, AMD Opteron™ processor or other processor. The processor 1302 is connected to a chipset 1304 by a processor bus 1306. The chipset 1304 is connected to random access memory (RAM) 1308 by a memory bus 1310 and manages access to the RAM 1308 by the processor 1302. The chipset is also connected to a peripheral bus 1312. The peripheral bus may be, for example, PCI, PCI-X, PCI Express or other peripheral bus. In some embodiments, an accelerator card 1318 may be connected to the peripheral bus 1312. The accelerator card 1318 may include ASIC or other hardware for accelerating processing 1320. The accelerator card 1318 may also include on-board memory 1322. The computer system 1300 also includes one or more network interface cards (NICs) 1314 connected to the peripheral bus for providing network interfaces to a network. External storage 1316, such as a disk array or other non-volatile storage, is also connected to peripheral bus 1312.

Software instructions for implementing any of the methods described above may be stored in memory 1308, storage 1316, on board memory 1322 or other computer readable media and may be processed by the processor 1302 or accelerator card 1318. Representations of target patterns, photomask patterns or blocks or portions of the foregoing and other inputs and outputs may also be stored in memory 1308, storage 1316, on board memory 1322 or other computer readable media and may be processed by the processor 1302 or accelerator card 1318. These items may be stored in data structures or files or in other formats. In some embodiments, as described above, a functional representation of a photomask pattern or portion of a photomask pattern may be stored in an array, where the value of the function at grid points across the area of the pattern are stored in the array. In some embodiments, the processor may process a photomask pattern or portion of a photomask pattern in a polygon representation such as GDSII or Oasis and convert it to a functional representation using a grid or pixelized representation. It may then be provided to on board memory 1322 and processed by the accelerator card 1318. The accelerator card 1318 may include specialized hardware 1320 that efficiently processes the functional representation, merit function and change function and can be used for iteratively adapting the pattern as described above.

Figure 4:
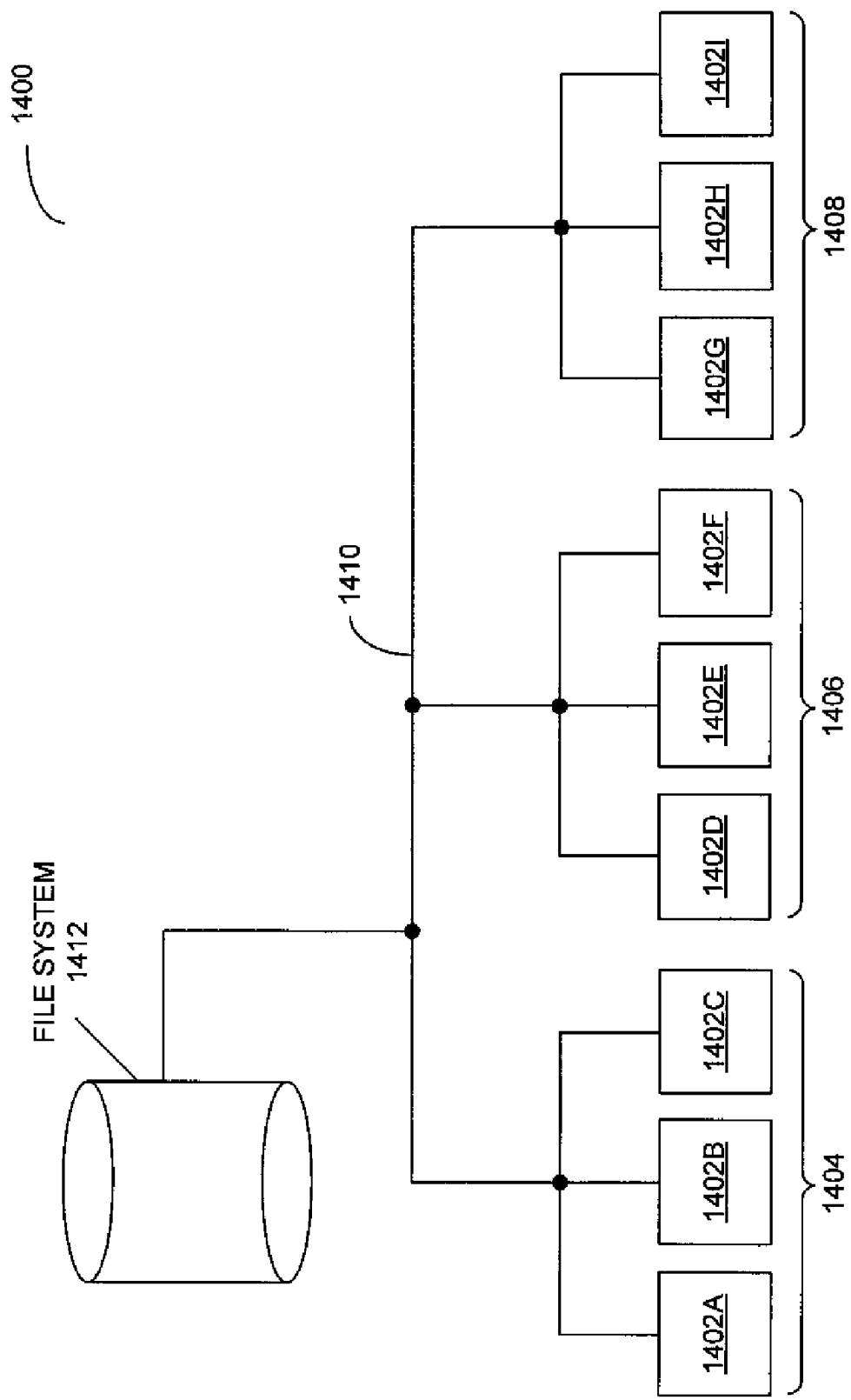
FIG. 4 is an example networked computer system according to an embodiment of the present invention.

FIG. 4 is a block diagram showing a networked computer system 1400, according to an embodiment of the present invention. In an example embodiment, each of the computers 1402*a-i* may have the architecture shown in FIG. 3 or other architecture and may be used for multi-processing to efficiently process a large integrated circuit design. The system may have a network file system 1412 (corresponding to external storage 1316 in FIG. 3) that is shared by the computers. It will be understood that other architectures may be used as well for multi-processing as described above, including a computer with multiple processors, a server with multiple blades or other architectures. One of the computers, or a group of computers 1404, may receive a target pattern for a layer of an integrated circuit device. This group of computers 1404 may convert the target pattern from hierarchical to flat format and divide the target pattern into blocks, which may include halos as described above in connection with FIG. 2.

In an example embodiment, the target pattern may be for a complex integrated circuit design with more than 10 million gates. In an example embodiment, the first group of computers may divide this pattern into 1 million or more blocks for processing. In an example embodiment, the design may include a minimum design feature size or pitch of 90 nm, 65 nm, 45 nm or less. The target pattern for the blocks generated by computers 1404 may be stored in files in file system 1412 or in data structures in memory and may be accessed by other sets of computers 1406 and 1408 over network 1410. The first set of computers 1404 may assign blocks to queues in file system 1412 to be processed by individual computers 1402*d, e* and *f*. In this way, the load can be balanced and a large complex design can be efficiently processed using multi-processing.

A second set of computers 1406 may access the blocks for processing. Each computer 1402*d, e* and *f* may be retrieve blocks from its queue and process them. The second set of computers may select functional or bit map representations for the patterns and iteratively adapt the patterns by evaluating merit functions. Change values may be added to adapt the pattern until a final output pattern is generated as described above. Other OPC or optimization methods may be used in some embodiments as well. The optimized patterns for each block may then be simplified or modified to enhance manufacturability (for example, to reduce the number of rectangles for fracturing) using any of the methods described above. The final pattern for the block may be stored in file system 1412 and accessed by a third set of computers 1408.

The third set of computers 1408 may assemble the blocks to generate the entire mask pattern, or a portion thereof, and convert mask pattern into a polygon representation such as GDSII or Oasis or other format. The resulting mask pattern may be stored as a file in file system 1412.

Other Variations

Aspects of the present invention may be applied to solving for an optimal grayscale or continuous tone photomask. Aspects of the invention may also be applied to maskless optical lithography, as well as optical mask writers. In these embodiments, instead of solving for the "optimal photomask", one would merely solve for the optimal pattern to be used in controlling the maskless optical lithography tool or optical mask writing tool.

Various elements and steps in the description and example embodiments above may be applied independently or in various combinations. For example, a variety of methods for finding the optimal photomask may be used in combination with aspects described above, including but not limited to the method of Nashold projections, variations of Fienap phase-retrieval algorithms, coherent approximation with deconvolution, local variations, descent searches, linear and nonlinear programming, pixel flipping, quadratic optimization, linear and nonlinear least squares, Gerchberg-Saxton algorithm, simulated annealing, genetic algorithms. Aspects of the present invention which can be applied to such methods may be so applied within the scope of the invention. For example, these methods may be used in combination with one or more of the following aspects described above: any of the above merit functions, any of the above pattern representations and associated conversion methods, any of the above parallel processing techniques including but not limited to dividing a pattern or file into blocks with halos for parallel processing, or other aspects of the embodiments described above. For example, the parallel system architecture described previously may be applied to a variety of photomask optimization methods. Elements of the Hamiltonian function described above may also be applied to a variety of optimization methods which can make use of a merit function. Other means of combining various aspects of the present invention with other optimization methods are also possible.

Accordingly, while there have been shown and described above various alternative embodiments of systems and methods of operation for the purpose of enabling a person of ordinary skill in the art to make and use the invention, it should be appreciated that the invention is not limited thereto. Accordingly, any modifications, variations or equivalent arrangements within the scope of the attached claims should be considered to be within the scope of the invention. In addition, the foregoing description of the principles of our invention is by way of illustration only and not by way of limitation. For example, although several illustrative embodiments of methodologies in accordance with the principles of our invention have been shown and described, other alternative embodiments are possible and would be clear to one skilled in the art upon an understanding of the principles of our invention. For example, several alternatives have been described for various steps described in this specification. It should be understood that one alternative is not disjoint from another alternative and that combinations of the alternatives may be employed in practicing the subject matter of the claims of this disclosure. Certainly the principles of our invention have utility apart from making photomasks for integrated circuits, some of which we have already mentioned. Accordingly, the scope of our invention is to be limited only by the appended claims.

Foregoing described embodiments of the invention are provided as illustrations and descriptions. They are not intended to limit the invention to precise form described.

In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

What is claimed is:

1. A computer-implemented method of modifying a photomask pattern for producing a target pattern in a region of a photomask comprising:
providing a functional representation of a first photomask pattern comprising a first plurality of values over the area of the region of the photomask;
modifying the functional representation of the first photomask pattern to produce a functional representation of a second photomask pattern based, at least in part, upon a merit function for the second photomask pattern and the target pattern;
wherein the functional representation of the second photomask pattern comprises a second plurality of values over the area of the region of the photomask;
wherein the functional representation of the first photomask pattern is capable of being fractured into a smaller number of rectangles than the functional representation of the second photomask pattern; and
wherein the functional representation of the second photomask pattern includes polygons having a smaller number of vertices than corresponding polygons in the functional representation of the first photomask pattern; and
determining a functional representation of a third photomask pattern that is capable of being fractured into a smaller number of rectangles than the functional representation of the second photomask pattern;
wherein the functional representation of the third photomask pattern comprises a third plurality of values over the area of the region of the photomask; and
wherein a merit function over the area of the region of the photomask for the third photomask pattern and the target pattern is improved relative to a merit function over the area of the region of the photomask for the first photomask pattern and the target pattern.

2. The computer-implemented method of claim 1, wherein the functional representation of each of the first photomask pattern, second photomask pattern and third photomask pattern is a pixel based representation.

3. The computer-implemented method of claim 2, further comprising convening the functional representation of the third photomask pattern into a polygon representation.

4. The computer-implemented method of claim 3, wherein the polygon representation has a higher resolution than the pixel size used in the pixel based representation of the third photomask pattern.

5. The computer-implemented method of claim 1, wherein the functional representation of each of the first photomask pattern, second photomask pattern and third photomask pattern is a distance function.

6. The computer-implemented method of claim 1, further comprising converting the functional representation of the third photomask pattern into a polygon representation.

7. The computer-implemented method of claim 1, wherein determining the functional representation of the third photomask pattern further comprises selecting adjacent values from the functional representation of the second photomask pattern that do not represent a straight boundary of the second photomask pattern and replacing them with values that represent a straight boundary for the third photomask pattern.

8. The computer-implemented method of claim 1, wherein determining the functional representation of the third photomask pattern further comprises selecting adjacent values from the functional representation of the second photomask pattern that do not represent a stair step boundary of the second photomask pattern and replacing them with values that represent a stair step boundary for the third photomask pattern.

9. The computer-implemented method of claim 1, wherein determining the functional representation of the third photomask pattern further comprises selecting adjacent values from the functional representation of the second photomask pattern that do not represent a 45 degree diagonal boundary of the second photomask pattern and replacing them with values that represent a 45 degree diagonal boundary for the third photomask pattern.

10. The computer-implemented method of claim 1, wherein the third photomask pattern has an area about equal to the second photomask pattern.

11. The computer-implemented method of claim 1, wherein the third photomask pattern has an area that is within +/−10% of the area of the second photomask pattern.

12. The computer-implemented method of claim 1, wherein determining the functional representation of the third photomask pattern further comprises comparing the area of the third photomask pattern to the area of the second photomask pattern.

13. The computer-implemented method of claim 1, wherein determining the functional representation of the third photomask pattern further comprises comparing a simulated wafer pattern for the third photomask pattern to a simulated wafer pattern for the second photomask pattern.

14. The computer-implemented method of claim 1, wherein a merit function over the area of the region of the photomask for the second photomask pattern and the target pattern is improved relative to a merit function over the area of the region of the photomask for the third photomask pattern and the target pattern;
and wherein the merit function for the third photomask pattern is closer to the merit function for the second photomask pattern than to the merit function for the first photomask pattern.

15. The computer-implemented method of claim 1, wherein a merit function over the area of the region of the photomask for the third photomask pattern and the target pattern is within one percent of a merit function over the area of the region of the photomask for the second photomask pattern and the target pattern.

* * * * *